(12) United States Patent
Nishizawa (10) Patent No.: US 9,887,131 B2
(45) Date of Patent: Feb. 6, 2018

(54) SEMICONDUCTOR DEVICE HAVING A PD-CONTAINING ADHESION LAYER

(71) Applicant: Mitsubishi Electric Corporation, Tokyo (JP)

(72) Inventor: Koichiro Nishizawa, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 15/111,048

(22) PCT Filed: Sep. 17, 2014

(86) PCT No.: PCT/JP2014/074567
§ 371 (c)(1),
(2) Date: Jul. 12, 2016

(87) PCT Pub. No.: WO2015/145815
PCT Pub. Date: Oct. 1, 2015

(65) Prior Publication Data
US 2016/0351442 A1 Dec. 1, 2016

(30) Foreign Application Priority Data
Mar. 27, 2014 (JP) .................................. 2014-066507

(51) Int. Cl.
*H01L 23/48* (2006.01)
*H01L 23/52* (2006.01)
(Continued)

(52) U.S. Cl.
CPC ...... *H01L 21/76864* (2013.01); *C23C 18/165* (2013.01); *C23C 18/1651* (2013.01);
(Continued)

(58) Field of Classification Search
CPC ............... H01L 23/481; H01L 23/5226; H01L 23/53238; H01L 23/53252; H01L 23/535;
(Continued)

(56) References Cited

U.S. PATENT DOCUMENTS 5,112,699 A * 5/1992 Chang .................... C30B 23/02
117/105
5,906,965 A * 5/1999 Rao .................... H01L 39/2422
428/930
(Continued)

FOREIGN PATENT DOCUMENTS

JP 2004-349595 A 12/2004
JP 2006-16684 A 1/2006
(Continued)

OTHER PUBLICATIONS

International Search Report issued in PCT/JP2014/074567; dated Jan. 6, 2015.
(Continued)

*Primary Examiner* — Ida M Soward
(74) *Attorney, Agent, or Firm* — Studebaker & Brackett PC (57) ABSTRACT

According to present invention, a semiconductor device includes a semiconductor substrate formed of GaAs, an adhesion layer formed of Pd or an alloy containing Pd on the semiconductor substrate, a barrier layer formed of Co or an alloy containing Co on the adhesion layer, and a metal layer formed of Cu, Ag or Au on the barrier layer.

7 Claims, 8 Drawing Sheets

(51) Int. Cl.

| | | |
|---|---|---|
| H01L 27/06 | (2006.01) | |
| H01L 29/45 | (2006.01) | |
| C23C 18/16 | (2006.01) | |
| C23C 28/00 | (2006.01) | |
| C25D 7/12 | (2006.01) | |
| H01L 21/768 | (2006.01) | |
| C23C 18/50 | (2006.01) | |
| H01L 23/532 | (2006.01) | |
| H01L 21/285 | (2006.01) | |
| C23C 18/32 | (2006.01) | |
| C23C 18/54 | (2006.01) | |
| H01L 21/8252 | (2006.01) | |
| H01L 23/522 | (2006.01) | |
| H01L 23/535 | (2006.01) | |

(52) U.S. Cl.
CPC ...... *C23C 18/1653* (2013.01); *C23C 18/1692* (2013.01); *C23C 18/32* (2013.01); *C23C 18/50* (2013.01); *C23C 18/54* (2013.01); *C23C 28/00* (2013.01); *C25D 7/123* (2013.01); *H01L 21/28575* (2013.01); *H01L 21/76846* (2013.01); *H01L 21/76877* (2013.01); *H01L 21/76895* (2013.01); *H01L 21/76898* (2013.01); *H01L 21/8252* (2013.01); *H01L 23/481* (2013.01); *H01L 23/5226* (2013.01); *H01L 23/535* (2013.01); *H01L 23/53238* (2013.01); *H01L 23/53252* (2013.01); *H01L 27/0605* (2013.01); *H01L 29/452* (2013.01); *H01L 2924/0002* (2013.01)

(58) Field of Classification Search
CPC . H01L 27/0605; H01L 29/452; C23C 18/165; C23C 18/1651; C23C 18/1653; C23C 18/1692; C23C 18/32; C23C 18/50; C23C 18/54; C23C 28/00; C25D 7/123
See application file for complete search history.

(56) References Cited

U.S. PATENT DOCUMENTS

| | | | |
|---|---|---|---|
| 6,180,523 B1 * | 1/2001 | Lee | ............ H01L 21/288 |
| | | | 257/E21.174 |
| 2011/0042822 A1 | 2/2011 | Nishizawa | |
| 2011/0195567 A1 | 8/2011 | Nishizawa | |
| 2012/0153477 A1 | 6/2012 | Shen | |
| 2014/0117549 A1 | 5/2014 | Tsunami et al. | |
| 2014/0239341 A1 * | 8/2014 | Matsumura | ............ H01L 33/36 |
| | | | 257/99 |

FOREIGN PATENT DOCUMENTS

| | | |
|---|---|---|
| JP | 2006-147653 A | 6/2006 |
| JP | 2011-165810 A | 8/2011 |
| JP | 2014-112634 A | 6/2014 |

OTHER PUBLICATIONS

An Office Action; "Notification of Reason for Rejection," issued by the Japanese Patent Office dated Nov. 8, 2016, which corresponds to Japanese Patent Application No. 2016-509883 and is related to U.S. Appl. No. 15/111,048; with English language partial translation.

Notification of Transmittal of Translation of the International Preliminary Report on Patentability and English translation of the Written Opinion of the International Searching Authority; PCT/JP2014/074567 dated Oct. 6, 2016.

The extended European search report issued by the European Patent Office dated Oct. 23, 2017, which corresponds a European Patent Application No. 14887601A-1373 and is related to U.S. Appl. No. 15/111,048.

\* cited by examiner

| PLATING ON GaAs | THICKNESS (as-depo) | P RATIO (as-depo) | STRESS (as-depo) | STRESS (250°C 1hr) |
|---|---|---|---|---|
| Pd-P | 0.3 μm | 5w% | 600MPa | 630MPa |
| Ni-P | 0.3 μm | 7w% | 110MPa | 1090MPa |
| Co-P | 0.3 μm | 5w% | 250MPa | 300MPa |
| Co-W-P | 0.3 μm | 5w% | 300MPa | 350MPa |

SEMICONDUCTOR DEVICE HAVING A PD-CONTAINING ADHESION LAYER

FIELD

The present invention relates to a semiconductor device having a metal layer used, for example, as an electrode and to a method of manufacturing the semiconductor device.

BACKGROUND

PTL 1 discloses a technique to form a barrier layer, a seed layer and a wiring layer on a side wall of an insulating film by a wet process.

PRIOR ART

Patent Literature

PTL 1: Japanese Patent Laid-Open No. 2006-16684

SUMMARY OF INVENTION

Problems to be Solved by the Invention

In some cases, a barrier layer is formed between a semiconductor substrate formed of GaAs and a metal layer formed of Cu, Ag or Au. The barrier layer is provided for the purpose of preventing a material in the metal layer from diffusing into the semiconductor substrate. The material of the barrier layer may be TiW, W, Ta, TaN, Ti, TiN, Co, Pd or Ru. In a case where one of these materials except Pd is used for the barrier layer, the adhesion between the barrier layer and the semiconductor substrate is insufficient because the reactivity between the barrier layer and GaAs is low.

In a case where Pd is used for the barrier layer, the barrier layer and the semiconductor substrate can easily form an alloy because the reactivity between the barrier layer and GaAs is high. With the formation of this alloy, there is a problem that the barrier layer fails to function as a barrier and the material of the metal layer diffuses into the semiconductor substrate.

The present invention has been achieved to solve the above-described problem, an object of the present invention is to provide a semiconductor device in which the material of a metal layer is prevented from diffusing into a semiconductor substrate, and in which the adhesion between the semiconductor substrate and a layer on the semiconductor substrate is high, and a method of manufacturing the semiconductor device.

Solution to Problem

According to the present invention, there is provided a semiconductor device including a semiconductor substrate formed of GaAs, an adhesion layer formed of Pd or an alloy containing Pd on the semiconductor substrate, a barrier layer formed of Co or an alloy containing Co on the adhesion layer, and a metal layer formed of Cu, Ag or Au on the barrier layer.

According to the present invention, there is provided a method of manufacturing a semiconductor device including a step of forming an adhesion layer of Pd or an alloy containing Pd on a semiconductor substrate formed of GaAs, a step of forming a barrier layer of Co or an alloy containing Co on the adhesion layer, and a heat treatment step of increasing the temperature of the semiconductor substrate, the adhesion layer and the barrier layer to 25° C. to 250° C. to form Pd—Ga—As on the adhesion layer and to form an alloy layer containing Co and Pd between the adhesion layer and the barrier layer.

According to the present invention, there is provided another method of manufacturing a semiconductor device, including a step of forming an adhesion layer of Pd or an alloy containing Pd on a semiconductor substrate formed of GaAs, a step of performing electroless plating on the semiconductor substrate to form a barrier layer of Co—P or Co—W—P on the adhesion layer, and a step of forming a metal layer of Cu, Ag or Au on the barrier layer.

Advantageous Effects of Invention

According to the present invention, an adhesion layer and a barrier layer are formed between the semiconductor substrate formed of GaAs and the metal layer, the adhesion layer being formed of Pd or an alloy containing Pd in contact with the semiconductor substrate, the barrier layer being formed of Co or an alloy containing Co, thereby preventing diffusion of the material of the metal layer into the semiconductor substrate and enabling improving the adhesion between the semiconductor substrate and the layer on the semiconductor substrate.

DESCRIPTION OF EMBODIMENTS

A semiconductor device and a method of manufacturing the semiconductor device according to an embodiment of the present invention will be described with reference to the drawings. Components corresponding or identical to each other are assigned the same reference characters and repeated description of them is avoided in some cases.

Embodiment 1

Figure 1:
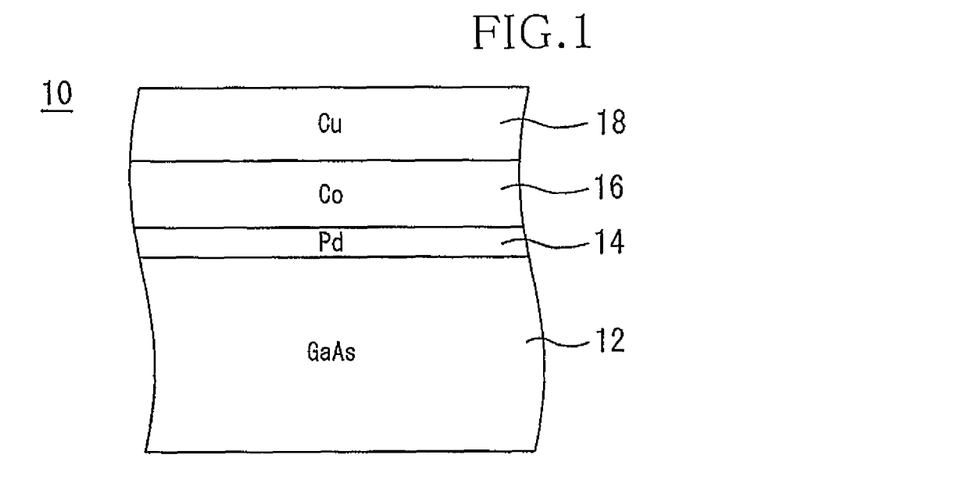
FIG. 1 is a sectional view of a semiconductor device according to Embodiment 1.

FIG. 1 is a sectional view of a semiconductor device 10 according to Embodiment 1 of the present invention. The semiconductor device 10 has a semiconductor substrate 12 formed of GaAs. An adhesion layer 14 is formed on the semiconductor substrate 12. The adhesion layer 14 is formed of Pd or an alloy containing Pd (Pd or an alloy containing Pd will hereinafter be referred to as a Pd material). The alloy containing Pd is, for example, Pd—P (Pd—P represents an alloy of Pd and P and an alloy will be expressed by using hyphen in the same way below).

A barrier layer 16 is formed on the adhesion layer 14. The barrier layer 16 is formed of Co or an alloy containing Co (Co or an alloy containing Co will hereinafter be referred to as a Co material). The adhesion layer 14 and the barrier layer 16 are formed in a way described below. First, in preprocessing, the semiconductor substrate 12 is immersed, for example, in 5% dilute hydrochloric acid for five minutes. The adhesion layer 14 and the barrier layer 16 are thereafter formed successively, for example, by deposition or sputtering process in a vacuum atmosphere. Successively forming the adhesion layer 14 and the barrier layer 16 enables prevention of oxidation and contamination on the surface of the adhesion layer 14 in contrast to forming the adhesion layer 14 and the barrier layer 16 in different process steps.

A metal layer 18 is formed on the barrier layer 16. The metal layer 18 is formed of Cu, Ag or Au. The metal layer 18 functions as an electrode of the semiconductor device 10, for example.

Figure 2:
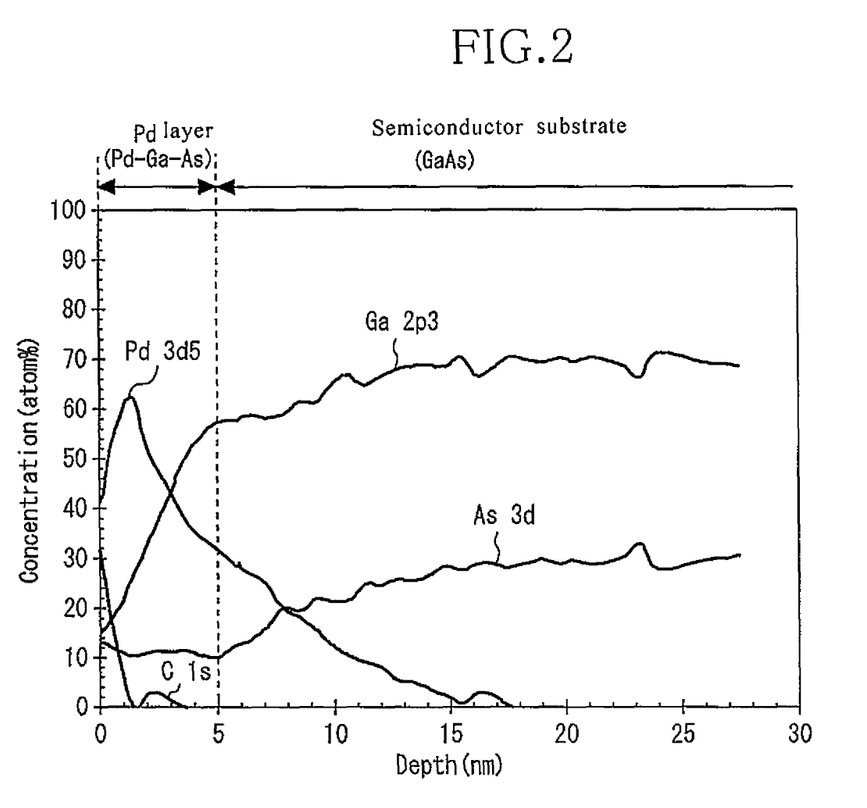
FIG. 2 is a diagram showing the results of XPS depth analysis.

FIG. 2 is a diagram showing the results of XPS depth analysis on a sample having a Pd layer deposited on a semiconductor substrate formed of GaAs. XPS depth analysis was performed on the sample in an as-deposited state (a state immediately after film forming). It can be understood from FIG. 2 that the Pd layer was formed as a Pd—Ga—As alloy layer. It is thought that the Pd layer has high adhesion to the semiconductor substrate due to the formation of Pd—Ga—As.

In the semiconductor device 10 according to Embodiment 1, the adhesion layer 14 is formed of a Pd material on the semiconductor substrate 12 and Pd—Ga—As is therefore formed in the adhesion layer 14. Sufficiently high adhesion between the semiconductor substrate and the layer (adhesion layer 14) on the semiconductor substrate can thus be achieved.

Further, Pd—Co is formed between the adhesion layer 14 formed of a Pd material and the barrier layer 16 formed of a Co material because Pd and Co are in such a relationship as to form an all proportional solid solution. Therefore the adhesion between the adhesion layer 14 and the barrier layer 16 is also good. For example, in a case where W, Ta, Ti or Ru is selected as the barrier layer, each of these materials is not in such a relationship with Pd as to form an all proportional solid solution and, therefore, the adhesion layer and the barrier layer do not adhere sufficiently to each other. It is, therefore, preferable to form the barrier layer 16 of a Co material.

The barrier layer 16 formed of a Co material and the semiconductor substrate 12 formed of GaAs have low reactivity therebetween and, therefore, do not alloy. Diffusion of the material of the metal layer 18 into the semiconductor substrate 12 can thus be prevented with the barrier layer 16.

Figure 3A:
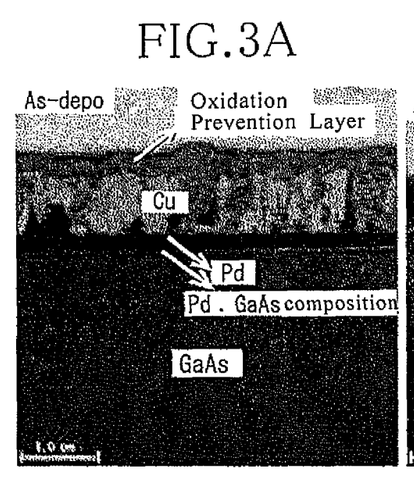
FIG. 3A is a sectional view of a sample before heat treatment.
Figure 3B:
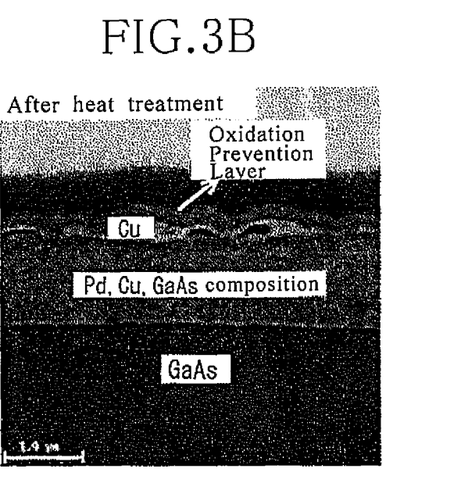
FIG. 3B is a sectional view of the sample after heat treatment.

FIG. 3A is a sectional view of a sample having a Pd layer provided between a semiconductor substrate formed of GaAs and a metal layer formed of Cu. FIG. 3B is a sectional view of the sample after the sample was heat-treated at 270° C. for three hours. It can be understood from FIG. 3B that the Pd layer reacted completely with the semiconductor substrate and almost the entire metal layer disappeared. That is, the Pd layer lost the property of functioning as a barrier to the metal layer. Thus, in the case where only the Pd layer is provided between the semiconductor substrate and the metal layer, the material (Cu) of the metal layer diffuses into the semiconductor substrate. Preventing this requires the barrier layer 16 formed of a Co material as in Embodiment 1 of the present invention.

Various modifications can be made in the semiconductor device 10 according to Embodiment 1 of the present invention. For example, the metal layer 18 may be of a two-layer structure having Au in a lower layer and Cu in an upper layer. This Au can be formed by deposition, sputtering or electroless displacement Au plating. In electroless displacement Au plating, a plating solution containing gold sulfite or sodium sulfite, for example, is used. Since Co in the barrier layer 16 is higher in ionization tendency than Au, replacement with Au can occur in the electroless Au plating solution to form Au.

Forming Au by electroless plating permits the organization of a low-cost process and enables suppression of corrosion and oxidation of the surface of the Co material. Forming Au by electroless plating enables Au to be uniformly formed on a projecting/recessed shape such as the shape of a through electrode structure (via structure). Au cannot be uniformly formed on a projecting/recessed shape by sputtering or deposition process.

Moreover, Cu in the upper layer has high adhesion to Au in the lower layer. In a case where Cu is formed by electroplating, the electrical resistance is reduced due to the existence of Au. As a result, the plating growth is stabilized and roughening of the plating surface and film thickness variation in the wafer (semiconductor substrate) surface can be inhibited. Thus, in the case where the metal layer is provided in a structure having two layers of Au and Cu, the electrical resistance value of the whole structure (electrode) above the semiconductor substrate 12 can be reduced in comparison with the case where the metal layer is formed only of Cu.

The metal layer 18 may be used not as an electrode but as a piece of wiring. These modifications can also be applied to semiconductor devices and methods of manufacturing semiconductor devices according to embodiments described below. The semiconductor devices and the semiconductor device manufacturing methods according to the embodiments described below will be described mainly with respect to points of difference from Embodiment 1.

Embodiment 2

Figure 4:
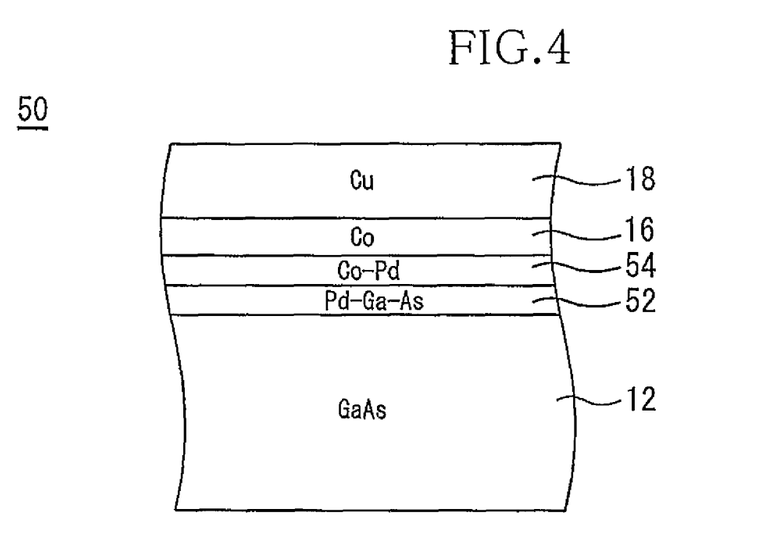
FIG. 4 is a sectional view of a semiconductor device according to Embodiment 2.

FIG. 4 is a sectional view of a semiconductor device 50 according to Embodiment 2 of the present invention. The whole of an adhesion layer 52 is formed of Pd—Ga—As. An alloy layer 54 containing Co and Pd is formed between the adhesion layer 52 and the barrier layer 16.

A method of manufacturing the semiconductor device 50 will be described. First, the adhesion layer is formed with Pd or an alloy containing Pd (Pd material) on the semiconductor substrate 12 formed of GaAs. Next, the barrier layer 16 is formed with Co or an alloy containing Co (Co material) on the adhesion layer.

Subsequently, the temperature of the semiconductor substrate, the adhesion layer and the barrier layer is increased to 25° C. to 250° C., thereby forming the adhesion layer 52 (Pd—Ga—As) and forming the alloy layer 54 containing Co and Pd between the adhesion layer 52 and the barrier layer 16. This process step is called a heat treatment step. It is preferable to execute the heat treatment step for about one hour in a nitrogen atmosphere.

The heat treatment step will be described. The Pd material and the semiconductor substrate (GaAs) start reacting with each other at a temperature equal to or higher than 20° C. Therefore the reaction between the Pd material and the semiconductor substrate 12 is promoted by the heat treatment step. If the thickness of the Pd material is about 5 nm, the adhesion layer entirely becomes Pa—Ga—As even when the heat treatment temperature is about 25° C. Also, since Co and Pd are in such a relationship as to form an all proportional solid solution, the alloy layer 54 is formed at the interface between Co and Pd by comparatively low heat.

The provision of the heat treatment step thus enables forming of the adhesion layer 52 formed of Pd—Ga—As and the alloy layer 54 formed of Co—Pd. An improvement in adhesion between the layers can thus be achieved.

Figure 5A:
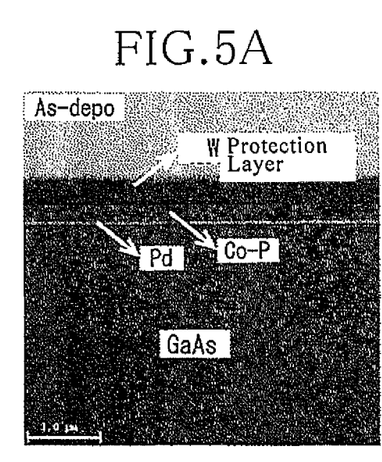
FIG. 5A is a sectional view of a sample before heat treatment.
Figure 5B:
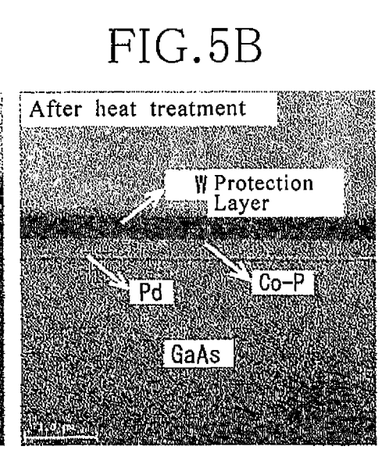
FIG. 5B is a sectional view of the sample after heat treatment.
Figure 6A:
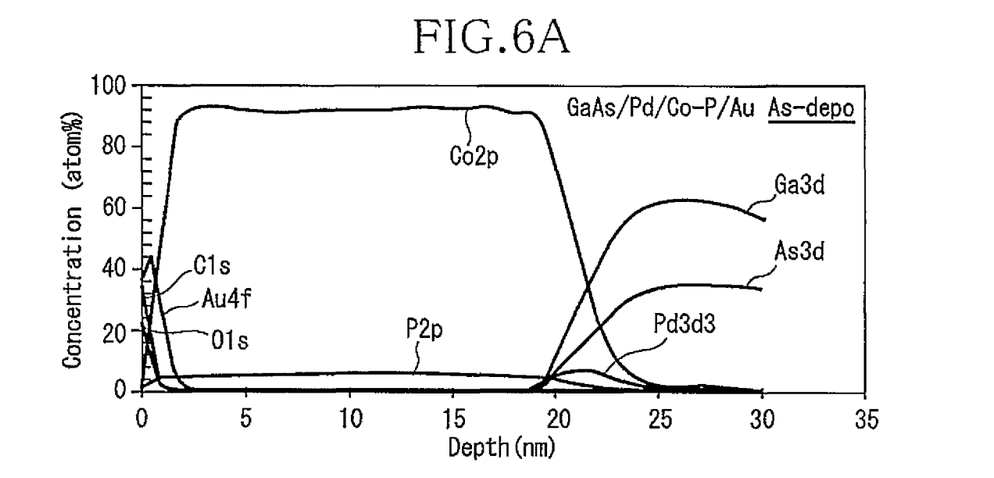
FIG. 6A is a diagram showing the results of XPS depth analysis on a sample before heat treatment.
Figure 6B:
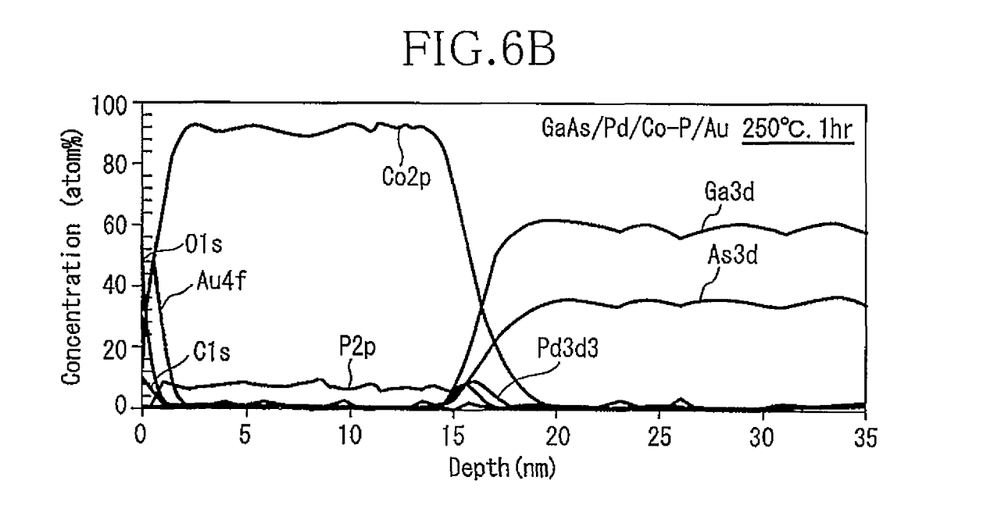
FIG. 6B is a diagram showing the results of XPS depth analysis on a sample after heat treatment.

FIG. 5A is a sectional view of a sample immediately after Co—P was formed on a semiconductor substrate formed of GaAs, with 5 nm-thick Pd film interposed therebetween. FIG. 5B is a sectional view of the sample after the sample was heat-treated at 250° C. for one hour. It can be understood from FIG. 5B that substantially no change in Co—P layer thickness occurred between the state before the heat treatment and the state after the heat treatment. FIG. 6A is a diagram showing the results of XPS depth analysis on a sample in an as-deposited state, the sample having a composition of GaAs/Pd/Co—P/Au. The layer on the right-hand side of any one of the slashes is formed on the layer on the left-hand side of the slash. Accordingly, this sample has the Pd layer on GaAs, Co—P on the Pd layer, and Au on Co—P. The layer thickness of the Pd layer is several nanometers. FIG. 6B is a diagram showing the results of XPS depth analysis after heat treatment at 250° C. for one hour on the sample analyzed as shown in FIG. 6A, It can be understood that the composition of GaAs/Pd/Co—P/Au is maintained even after the heat treatment. From the sectional views of FIG. 5 and the XPS depth analysis results shown in FIG. 6, it can be understood that the Co material does not easily diffuse into the semiconductor substrate formed of GaAs. It was also found from another experiment that Co—P does not react with the semiconductor substrate (GaAs) at a temperature equal to or lower than 375° C. Consequently, the barrier layer 16 formed of the Co material does not react with GaAs to impair the property of functioning as a barrier to Cu (metal layer), thus enabling prevention of diffusion of the material of the metal layer 18 into the semiconductor substrate 12.

It is preferable to perform the above-described heat treatment step after forming of the metal layer 18. Since Co in the barrier layer 16 and Cu, Ag or Au in the metal layer 18 are in such a relationship as to form an all proportional solid solution, an alloy layer can be formed at the interface therebetween by the heat treatment step. For forming of this alloy layer, it is preferable to execute the heat treatment, for example, at 250° C. for one hour. By forming the alloy layer, the adhesion between the layers is improved. Improvements in characteristics of the semiconductor device and a reduction in size of the semiconductor device can be achieved thereby.

Pd—Ga—As may form part of the adhesion layer 52 instead of forming the whole of the adhesion layer 52.

Embodiment 3

Figure 7:
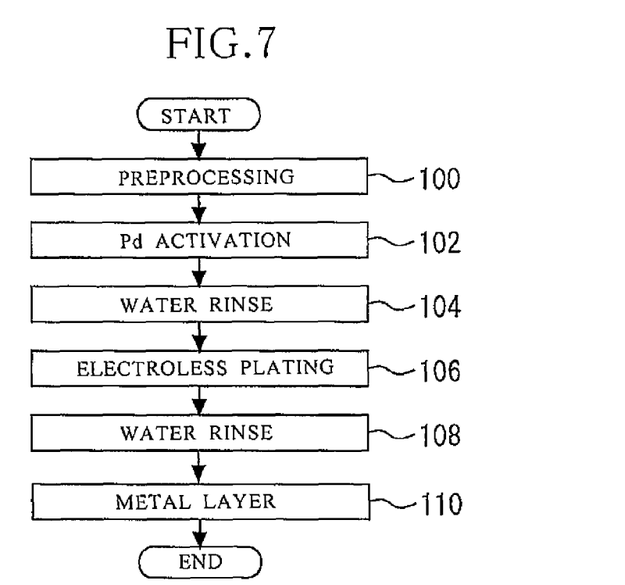
FIG. 7 is a flowchart showing a method of manufacturing a semiconductor device according to Embodiment 3.

FIG. 7 is a flowchart showing a method of manufacturing a semiconductor device according to Embodiment 3 of the present invention. One of the features of this manufacturing method resides in forming the barrier layer by electroless plating. First, preprocessing is performed, for example, for five minutes with 5% dilute hydrochloric acid in order to remove, for example, a surface oxide on the semiconductor substrate formed of GaAs (step 100).

The process then advances to step 102. In step 102, the adhesion layer is formed with Pd or an alloy containing Pd on the semiconductor substrate formed of GaAs. The adhesion layer is formed, for example, by performing Pd activation processing on the semiconductor substrate surface. The Pd activation processing is, for example, processing in which the semiconductor substrate is immersed for three minutes in a solution including Pd ions such as a palladium chloride solution at a temperature equal to or lower than 30° C.

It is preferable to set the layer thickness of the adhesion layer to a value equal to or larger than 1 nm and equal to or smaller than 30 nm. If the thickness is above this range, an adhesion fault occurs. If the thickness is below this range, a fault in forming of, for example, Co—P formed on the adhesion layer occurs. In the above-described process step, the adhesion layer (Pd layer) can be formed to about 1 to 30 nm.

Figure 8:
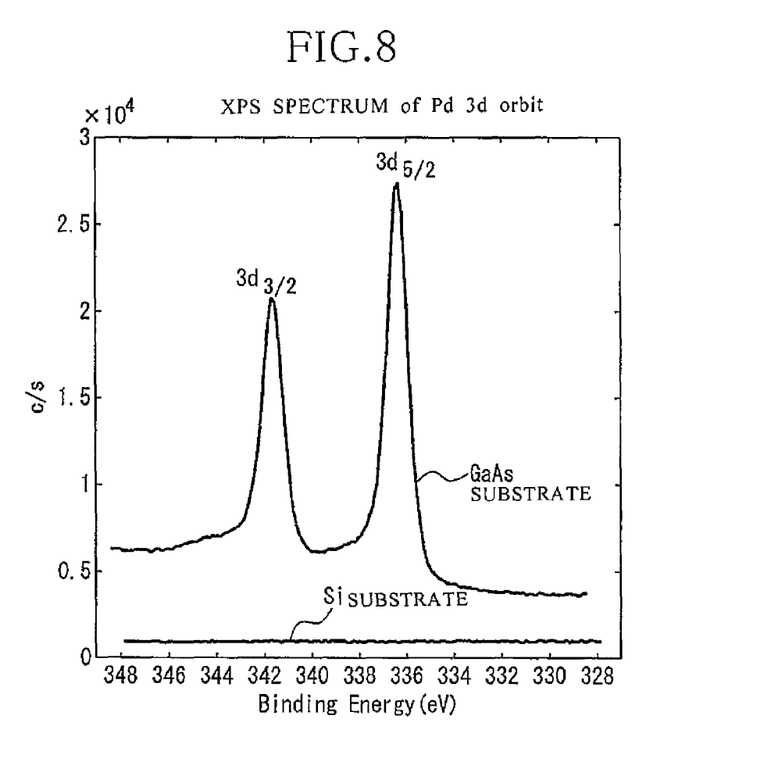
FIG. 8 is a graph showing the results of XPS analysis.

FIG. 8 is a graph showing the results of XPS analysis on semiconductor substrates after Pd activation processing. FIG. 8 shows the results of XPS analysis in a case where Pd activation processing was performed on a semiconductor substrate formed of GaAs (GaAs substrate) and the results of XPS analysis in a case where Pd activation processing was performed on a semiconductor substrate formed of Si (Si substrate). Peaks of the Pd 3d orbitals appear in the XPS spectrum of the GaAs substrate. It can therefore be understood that Pd is sufficiently attached to the GaAs substrate.

Figure 9:
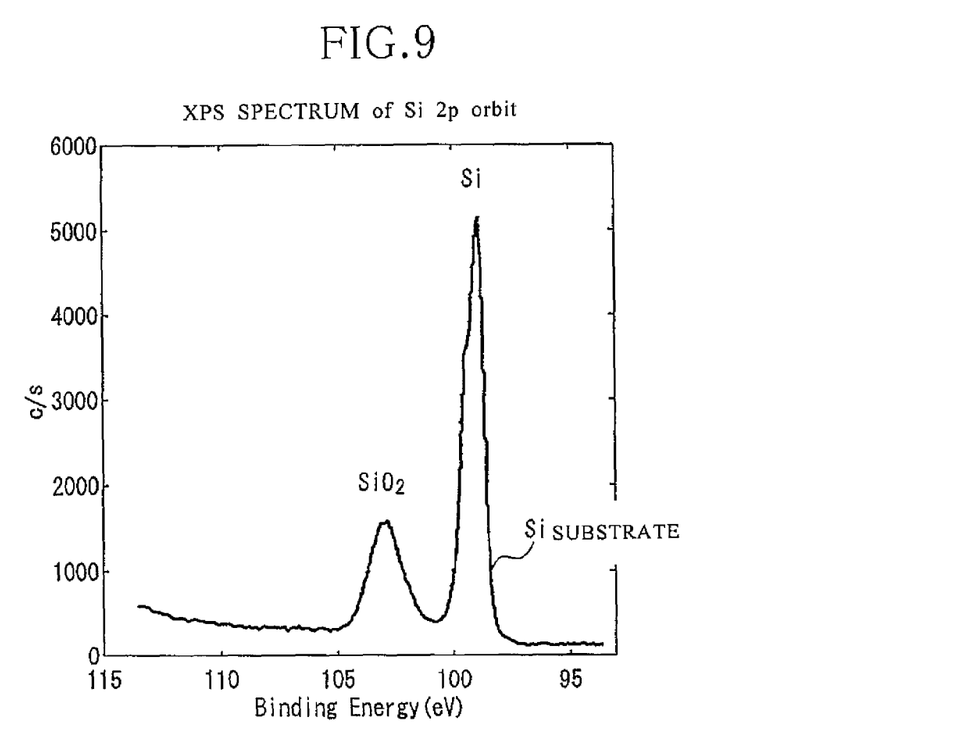
FIG. 9 is a graph showing the results of XPS analysis.

On the other hand, no peaks of the Pd 3d orbitals appear in the XPS spectrum of the Si substrate. It can therefore be understood that Pd cannot be formed on the Si substrate. FIG. 9 is a graph showing the results of XPS analysis on the Si 2p orbitals in the case where Pd activation processing was performed on the Si substrate. Because peaks of $SiO_2$ were detected, it can be understood that the surface was oxidized. The cause of the oxidation of the surface of the Si substrate is thought to be the occurrence of oxidation-reduction reaction with a Pd catalyst in Pd activation processing. This oxidation is the cause of the phenomenon in which Pd does not adhere to the Si substrate.

The process then advances to step 104. In step 104, surplus Pd attached to the GaAs substrate is washed off with pure water. Step 104 may be removed. The process then advances to step 106. In step 106, electroless plating is performed on the semiconductor substrate to form the barrier layer with Co—P or Co—W—P on the adhesion layer. For example, the semiconductor substrate is immersed in an electroless Co plating solution to form Co—P. The electroless Co plating solution is, for example, a plating solution prepared by adding a complexing agent or the like to cobalt sulfate and sodium phosphinate.

The process then advances to step 108. In step 108, the semiconductor substrate is washed with pure water. Step 108 may be removed. The process then advances to step 110. In step 110, a metal layer formed of Cu, Ag or Au is formed on the barrier layer.

In the method of manufacturing a semiconductor device according to Embodiment 3 of the present invention, the barrier layer is formed by electroless plating and can therefore be formed by batch processing. Also, the barrier layer can be formed only on the semiconductor substrate by electroless plating. Therefore the film forming efficiency is improved in comparison with a sputtering or deposition process in which film is formed on the entire chamber inner wall, thus reducing the process cost.

Also, since the barrier layer is formed by electroless plating, the barrier layer can be uniformly formed on a projecting/recessed shape such as the shape of a through electrode structure (via structure). Diffusion of the material of the metal layer into the semiconductor substrate can therefore be prevented with reliability. The barrier layer cannot be uniformly formed on a projecting/recessed shape by sputtering or deposition process.

Figure 10:
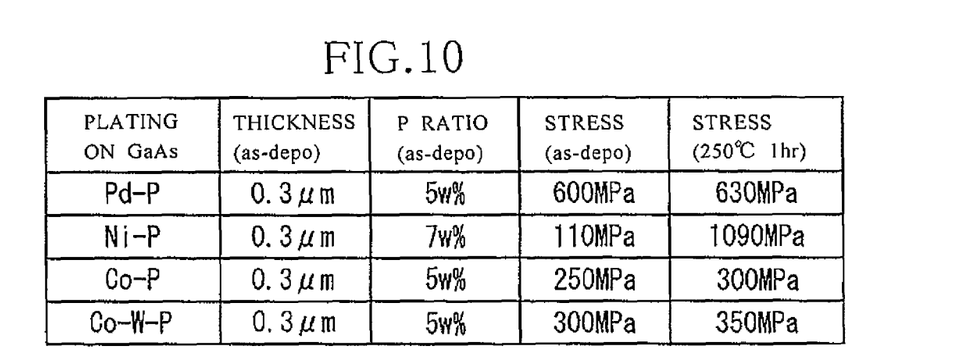
FIG. 10 is a table showing characteristics of four samples (Pd—P, Ni—P, Co—P, Co—W—P).

FIG. 10 is a table showing characteristics of four samples (Pd—P, Ni—P, Co—P, Co—W—P). Each of Pd—P, Ni—P, Co—P and Co—W—P is formed by electroless plating on a GaAs substrate on which Pd is formed to about 5 nm by Pd activation processing.

In the rightmost column in FIG. 10, film stress after heat treatment on each sample at 250° C. for one hour is shown. It can be understood that Co—P has the smallest film stress after the heat treatment. The value of film stress in Co—W—P is also low. The reason that the film stress is small in Co—P and Co—W—P is thought to be that the reactivity of Co with the GaAs substrate is lower than that of Pd or Ni. Pd—P reacts with the GaAs substrate at a low temperature equal to or higher than 20° C. Therefore this reaction progresses even in the as-deposited state to cause high film stress. Consequently, it is preferable to form the barrier layer with the Co material in order to reduce the film stress.

Figure 11:
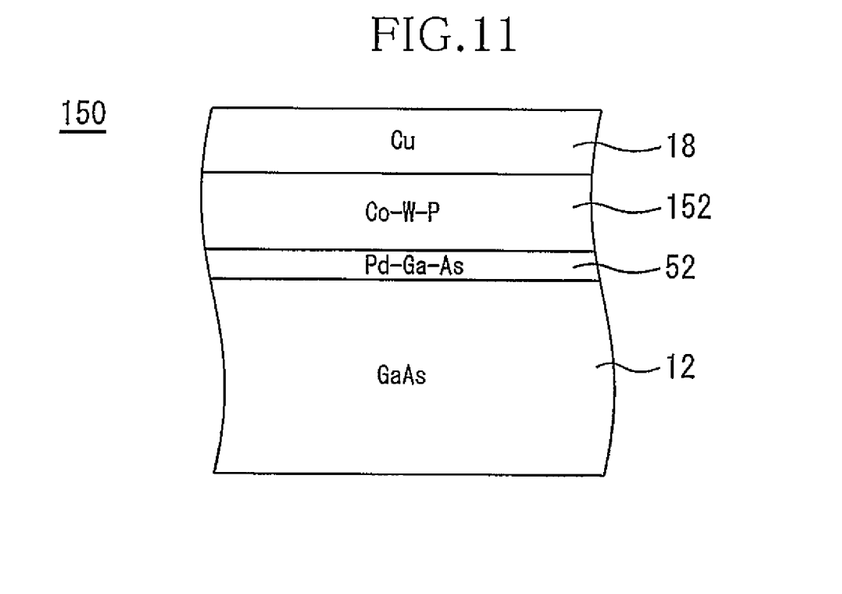
FIG. 11 is a sectional view of a semiconductor device having a barrier layer formed by Co—W—P electroless plating.
Figure 12A:
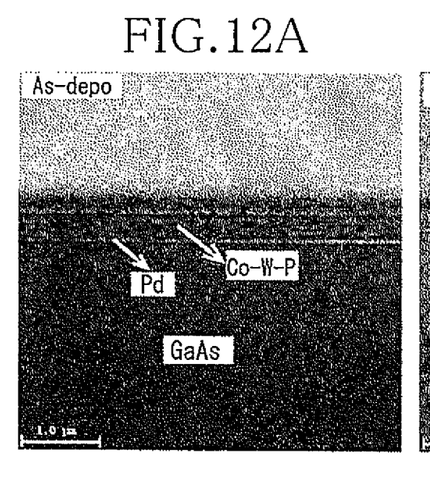
FIG. 12A is a sectional view of a sample before heat treatment.
Figure 12B:
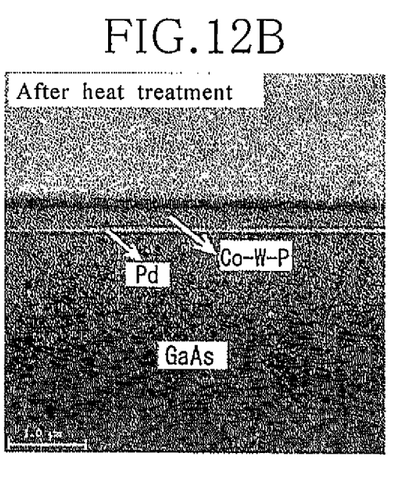
FIG. 12B is a sectional view of the sample after heat treatment.
Figure 13A:
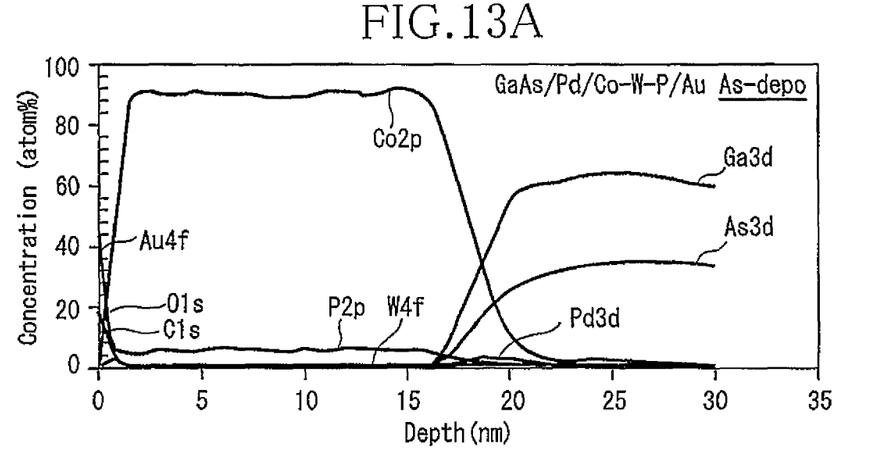
FIG. 13A is a diagram showing the results of XPS depth analysis on a sample before heat treatment.
Figure 13B:
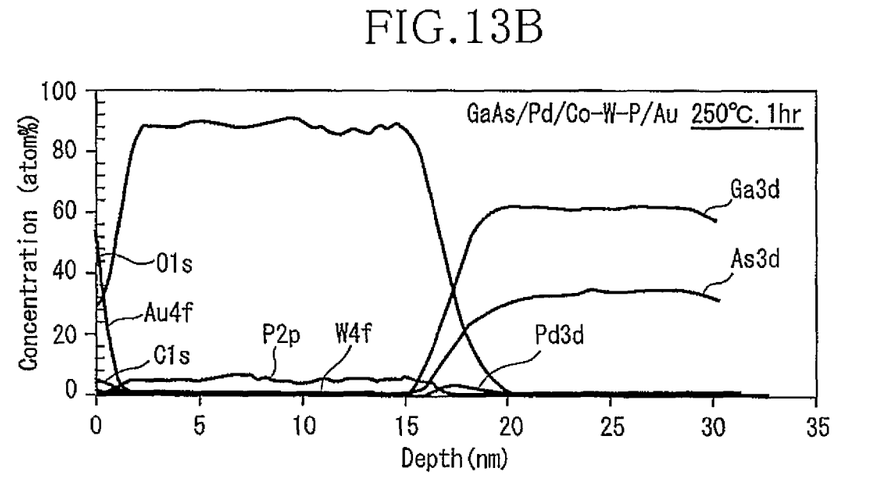
FIG. 13B is a diagram showing the results of XPS depth analysis on a sample after heat treatment.

FIG. 11 is a sectional view of a semiconductor device 150 having a barrier layer 152 formed by Co—W—P electroless plating. Addition of the high-melting-point material W to the barrier layer 152 ensures prevention of diffusion of the material of the metal layer 18 (for example, Cu) into the semiconductor substrate 12. FIG. 12A is a sectional view of a sample having Co—W—P formed on a GaAs substrate with a Pd layer (several nanometers) interposed therebetween. FIG. 12B is a sectional view of the sample after the sample was heat-treated at 250° C. for one hour. No changes in layer thickness and the condition of the interface are observed between the state before the heat treatment and the state after the heat treatment. FIG. 13A is a diagram showing the results of XPS depth analysis on a sample in an as-deposited state, the sample having a composition of GaAs/Pd/Co—W—P/Au. The layer on the right-hand side of any one of the slashes is formed on the layer on the left-hand side of the slash. FIG. 13B is a diagram showing the results of XPS depth analysis after heat treatment at 250° C. for one hour on the sample analyzed as shown in FIG. 13A. It can be understood that the composition of GaAs/Pd/Co—W—P/Au is maintained even after the heat treatment. From the sectional views of FIG. 12 and the XPS depth analysis results shown in FIG. 13, it can be understood that the stability of the barrier layer formed of Co—W—P on the GaAs substrate is high. Consequently, prevention of diffusion of the material of the metal layer into the semiconductor substrate can be ensured.

A suitable combination of the features of the embodiments described above may be made and used as desired.

DESCRIPTION OF SYMBOLS 10 semiconductor device, 12 semiconductor substrate, 14 adhesion layer, 16 barrier layer, 18 metal layer, 50 semiconductor device, 52 adhesion layer, 54 alloy layer, 150 semiconductor device, 152 barrier layer

The invention claimed is:

1. A semiconductor device comprising:
a semiconductor substrate formed of GaAs;
an adhesion layer formed of Pd or an alloy containing at least Pd and either P or GaAs on the semiconductor substrate;
a barrier layer formed of Co or an alloy containing Co on the adhesion layer; and
a metal layer formed of Cu, Ag or Au on the barrier layer.

2. A semiconductor device comprising:
a semiconductor substrate formed of GaAs;
an adhesion layer formed of Pd or an alloy containing Pd on the semiconductor substrate;
a barrier layer formed of Co or an alloy containing Co on the adhesion layer; and
a metal layer formed of Cu, Ag or Au on the barrier layer, wherein part of the adhesion layer is formed of Pd—Ga—As.

3. A semiconductor device comprising:
a semiconductor substrate formed of GaAs;
an adhesion layer formed of Pd or an alloy containing Pd on the semiconductor substrate;
a barrier layer formed of Co or an alloy containing Co on the adhesion layer; and
a metal layer formed of Cu, Ag or Au on the barrier layer, wherein the entire adhesion layer is formed of Pd—Ga—As.

4. A semiconductor device comprising:
a semiconductor substrate formed of GaAs;
an adhesion layer formed of Pd or an alloy containing Pd on the semiconductor substrate;
a barrier layer formed of Co or an alloy containing Co on the adhesion layer; and
a metal layer formed of Cu, Ag or Au on the barrier layer, and
an alloy layer containing Co and Pd between the adhesion layer and the barrier layer.

5. The semiconductor device according to claim 1, wherein the layer thickness of the adhesion layer is equal to or larger than 1 nm and equal to or smaller than 30 nm.

6. A semiconductor device comprising:
a semiconductor substrate formed of GaAs;
an adhesion layer formed of Pd or an alloy containing Pd on the semiconductor substrate;
a barrier layer formed of Co or an alloy containing Co on the adhesion layer; and
a metal layer formed of Cu, Ag or Au on the barrier layer, wherein the adhesion layer is formed of Pd—P.

7. The semiconductor device according to claim 1, wherein the barrier layer is formed of Co—P or Co—W—P.

* * * * *